(12) United States Patent
Gudem et al.

(10) Patent No.: US 7,145,395 B2
(45) Date of Patent: Dec. 5, 2006

(54) LINEAR TRANSCONDUCTANCE CELL WITH WIDE TUNING RANGE

(75) Inventors: Prasad Gudem, San Diego, CA (US); Gurkanwal Kamal Sahota, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 10/944,145

(22) Filed: Sep. 16, 2004

(65) Prior Publication Data

US 2006/0055463 A1    Mar. 16, 2006

(51) Int. Cl.
    *H03G 3/12*    (2006.01)
(52) U.S. Cl. ............... 330/283; 330/253; 330/305
(58) Field of Classification Search ........ 330/252–253, 330/260–261, 283, 303, 305
    See application file for complete search history.

(56) References Cited

U.S. PATENT DOCUMENTS 3,852,679 A * 12/1974 Schade, Jr. ............. 330/257
5,612,648 A    3/1997 McClellan et al. ......... 330/253
5,978,241 A   11/1999 Lee et al. ................. 363/73
5,999,055 A   12/1999 Kimura et al. ............ 330/255
6,150,885 A *  11/2000 Ashby et al. ............. 330/257
6,600,373 B1   7/2003 Bailey et al. ............. 330/260
2004/0183598 A1*  9/2004 Behzad ..................... 330/253

FOREIGN PATENT DOCUMENTS

| EP | 0726652 | 2/1995 |
| EP | 587 965 | 8/1999 |
| JP | 11168334 | 6/1999 |
| JP | 168938 | 6/2003 |

* cited by examiner

*Primary Examiner*—Robert Pascal
*Assistant Examiner*—Hieu Nguyen
(74) *Attorney, Agent, or Firm*—Philip Wadsworth; Charles D. Brown; Donald C. Kordich

(57) ABSTRACT

A transconductance cell is disclosed. The transconductance cell may be single-ended or differential. The transconductance cell may include a tunable degeneration circuit. The tunable degeneration circuit may have a plurality of field effect transistors connected in series with each of the field effect transistors having a gate configured to receive a tuning voltage.

12 Claims, 6 Drawing Sheets

LINEAR TRANSCONDUCTANCE CELL WITH WIDE TUNING RANGE

BACKGROUND

1. Field

The present disclosure relates generally to electronics, and more specifically, to a transconductance cell with good tuning range.

2. Background

Filters are used extensively today in almost every electronic application. A filter is an electrical network that alters the amplitude and/or phase characteristics of a signal with respect to frequency. Thus, a filter may be used in an electronic circuit to emphasize signals in certain frequency ranges and reject signals in other frequency ranges. The behavior of a filter may be described mathematically in the frequency-domain in terms of its transfer function. The transfer function describes the effect of the filter on the amplitude of the input signal at various frequencies.

A transconductance cell (Gm-cell) is often used as a basic building block in filter design, such as low-pass filters. A low-pass filter passes low frequency signals, and rejects signals at frequencies above the filter's pole frequency. The filter's pole frequency is equal to the frequency at which the signal output drops 3 dB below the center frequency. The range of frequencies below the pole frequency is known as the filter's passband. An ideal low-pass filter has a transfer function with a flat response over its passband. However, in actual implementation, the low-pass filter may experience signal distortions in its passband due to the nonlinearity of the Gm-cell. Accordingly, there is a continuing need in the art for Gm-cells with improved linearity for low-pass filter design.

SUMMARY

In one aspect of the present invention, a transconductance cell includes a tunable degeneration circuit having a plurality of field effect transistors connected in series, each of the field effect transistors having a gate configured to receive a tuning voltage.

In another aspect of the present invention, a transconductance cell includes a tunable degeneration circuit having a tapped voltage divider network configured to receive a tuning voltage. The tunable degeneration circuit also includes a plurality of field effect transistors connected in series, each of the field effect transistors having a gate coupled to a different one of the taps.

In yet another aspect of the present invention, a differential transconductance cell includes a pair of input transistors, and a tunable degeneration circuit having a first leg comprising a plurality of field effect transistors connected in series and a second leg comprising a plurality of field effect transistors connected in series, one end of the first leg being coupled to a first one of the input transistors and one end of the second leg being coupled to a second one of the input transistors, each of the field effect transistors having a gate configured to receive a tuning voltage.

In still another aspect of the present invention, a differential transconductance cell includes a pair of input devices, and a tunable degeneration circuit having a first leg comprising a plurality of field effect transistors connected in series and a second leg comprising a plurality of field effect transistors connected in series, one end of the first leg being coupled to a first one of the input transistors and one end of the second leg being coupled to a second one of the input transistors. The tunable degeneration circuit further includes a tapped voltage divider network configured to receive a tuning voltage with each pair of field effect transistors having gates coupled to a different one of a plurality of taps, each of the field effect transistor pairs comprising one of the field effect transistors from the first leg and one of the field effect transistors from the second leg.

In a further aspect of the present invention, a filter includes a transconductance cell having a tunable degeneration circuit, the tunable degeneration circuit having a plurality of field effect transistors connected in series, each of the field effect transistors having a gate configured to receive a tuning voltage. The filter also includes a shunt capacitor coupled to the output of the transconductance cell.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings wherein.

DETAILED DESCRIPTION

The detailed description set forth below in connection with the appended drawings is intended as a description of various embodiments of the present invention and is not intended to represent the only embodiments in which the present invention may be practiced. Each embodiment described in this disclosure is provided merely as an example or illustration of the present invention, and should not necessarily be construed as preferred or advantageous over other embodiments. The detailed description includes specific details for the purpose of providing a thorough understanding of the present invention. However, it will be apparent to those skilled in the art that the present invention may be practiced without these specific details. In some instances, well-known structures and devices are shown in block diagram form in order to avoid obscuring the concepts of the present invention.

Figure 1:
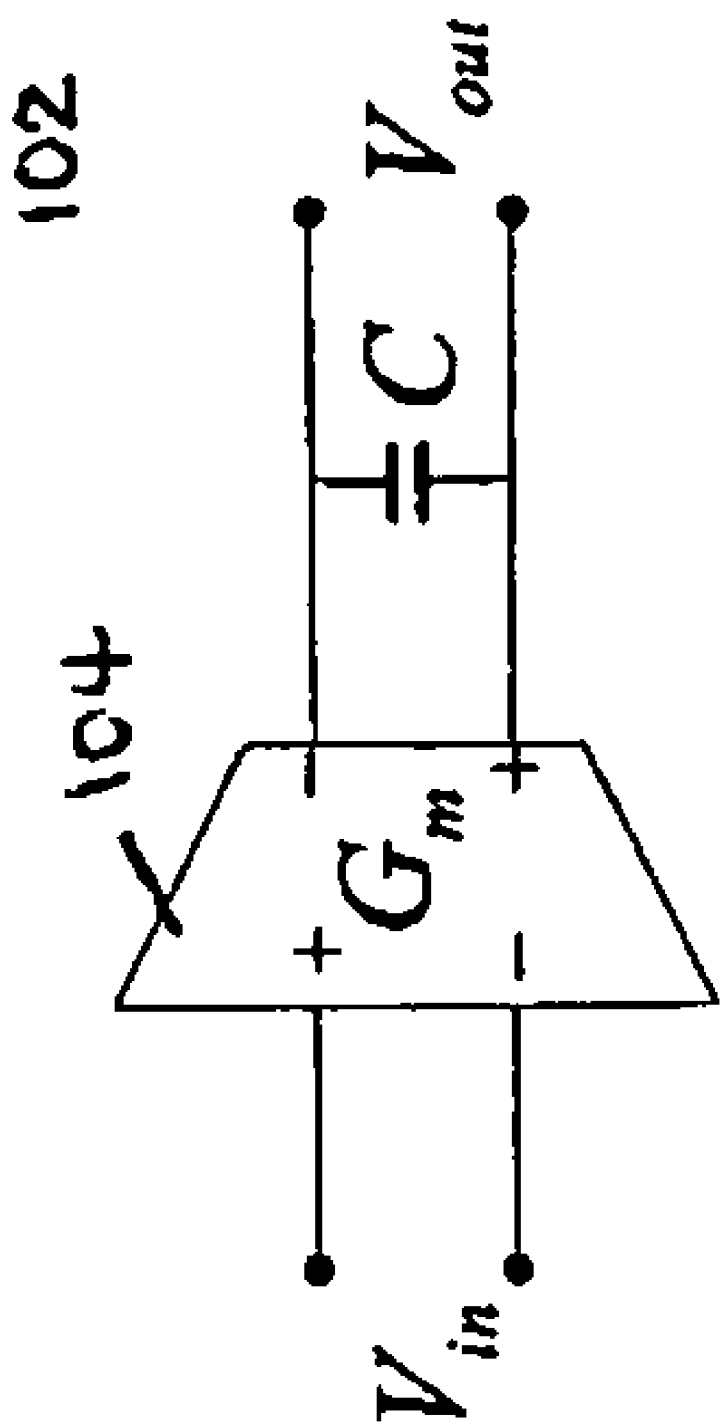
FIG. 1 is a functional block diagram of a filter using a Gm-cell.

FIG. 1 is a functional block diagram of a filter. The filter 102 may employ a Gm-cell 104, with a shunt capacitor C in the output circuit, to generate the desired filter response. The transfer function of the filter 102 may be represented in the frequency domain by the following equation:

$$V_{out} = \frac{V_{in}}{s/(G_m/C)} \quad (1)$$

where $G_m$ is the transconductance of the Gm-cell.

As explained earlier, the filter's pole frequency is equal to the frequency at which the signal output $V_{out}$ drops 3 dB below the center frequency. With this definition in mind, one can readily see by inspection that the pole frequency varies with transconductance, and therefore, the bandpass of the filter may be controlled by adjusting the transconductance of the Gm-cell 104.

Figure 2:
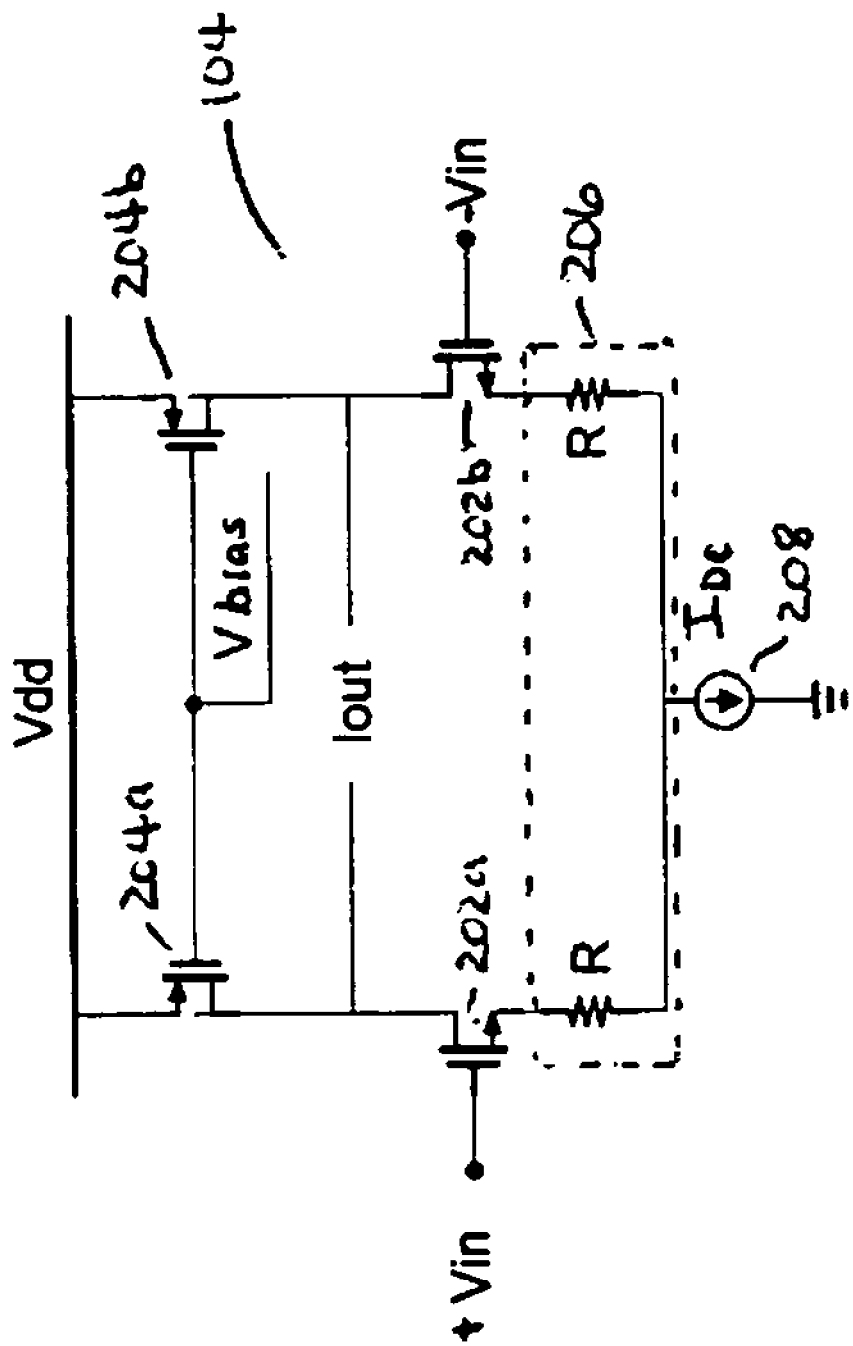
FIG. 2 is a schematic diagram of a Gm-cell employing a symmetrical source-coupled differential amplifier.

FIG. 2 is a schematic diagram of a Gm-cell comprising a symmetrical source-coupled differential amplifier. The Gm-cell 104 is shown with a pair of input n-channel field effect transistors (FET) 202a and 202b, but could alternatively be implemented with a pair of p-channel FETs. Each input FET 202a and 202b includes an active load 204a and 204b, respectively, in its drain circuit. The active loads are shown as p-channel FETs, but could alternatively be n-channel FETs. The Gm-cell 104 may also include a degeneration circuit 206 implemented with a feedback resistor R in the source circuit of each input FET 202a and 202b. A constant current source 208 may be coupled to the degeneration circuit 206.

The feedback resistors R may be used to improve the linearity of the Gm-cell 104, resulting in a transfer function with a relatively flat response over its passband. Unfortunately, the feedback resistors R result in a Gm-cell 104 with a fixed transconductance, and therefore, it may be difficult to adjust the filter's passband to compensate for process, voltage and temperature variations. To ensure the passband of the filter remains constant across process, voltage and temperature variations, the transconductance of the Gm-cell should be tunable. This may be accomplished by replacing the fixed feedback resistor R with a variable one.

Figure 3:
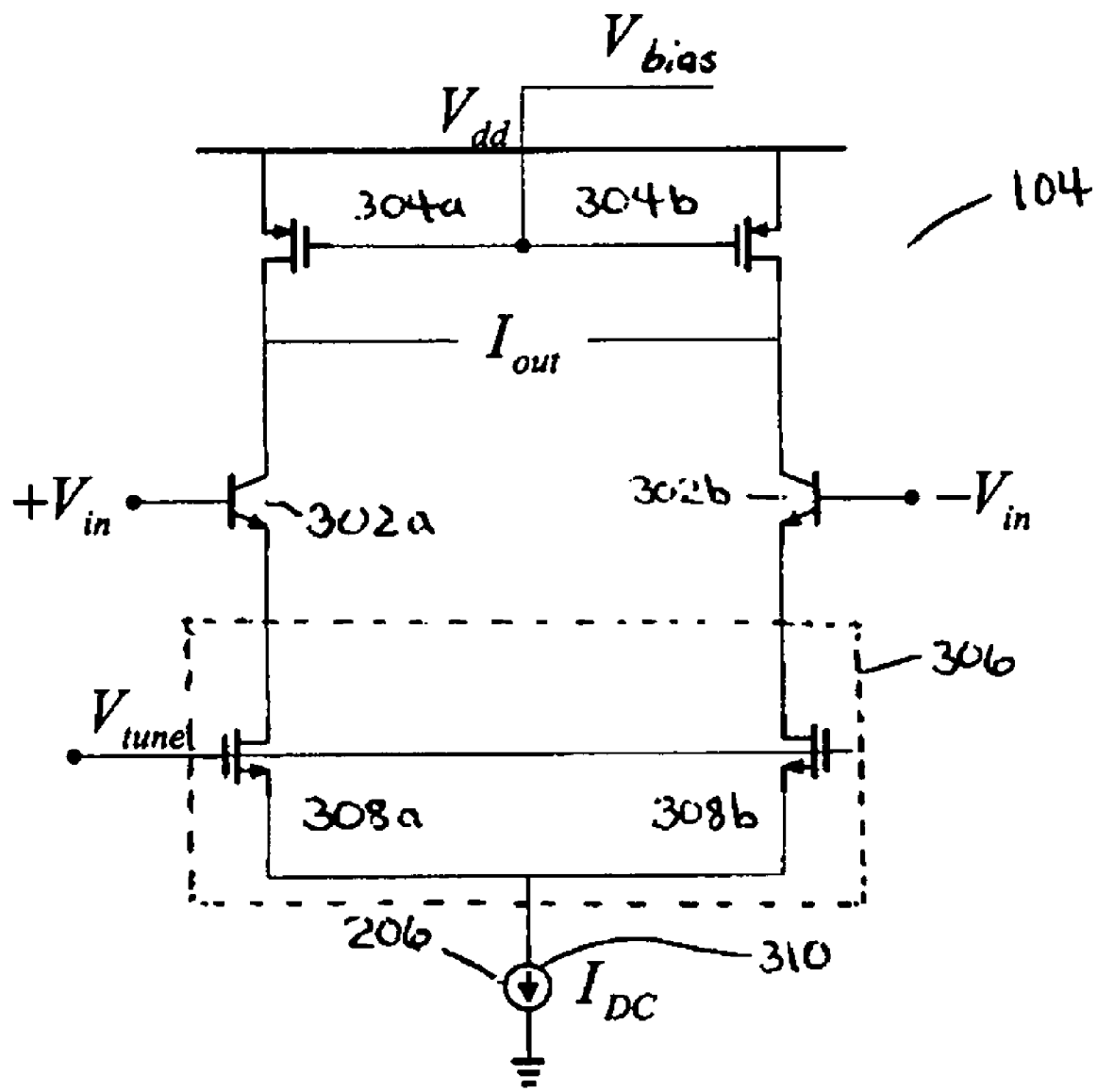
FIG. 3 is a schematic diagram of a tunable Gm-cell employing field effect transistors (FETs) as variable resistors in a degeneration circuit.

FIG. 3 is a schematic diagram of a tunable Gm-cell which uses field effect transistors (FET) as variable feedback resistors in the degeneration circuit. The Gm-cell 104 may include a pair of input bipolar transistors 302a and 302b, each having an active load 304a and 304b, respectively, in its collector circuit. The Gm-cell 104 may also include a tunable degeneration circuit 306 implemented with a FET 308a and 308b in the emitter circuit of each input transistor 302a and 302b. A constant source 310 may be coupled to the tunable degeneration circuit 306.

Figure 4:
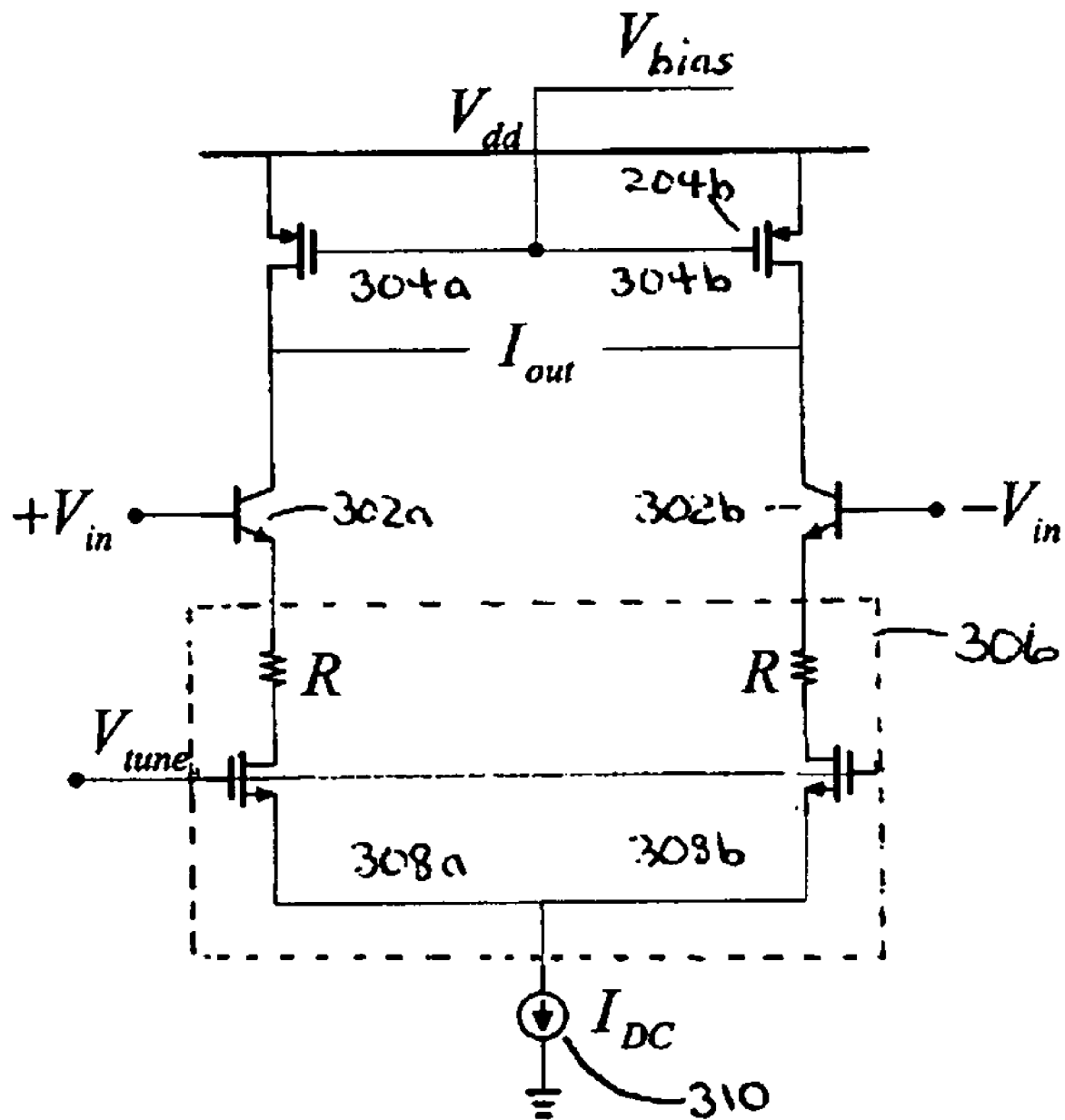
FIG. 4 is a schematic diagram of a tunable Gm-cell employing field effect transistors (FETs) in combination with fixed resistors in the degeneration circuit.

The FETs 308a and 308b provide a means for varying the transconductance of the Gm-cell 104 by applying a tuning voltage to the gates. The drawback of this approach is that the linearity of the filter may suffer due to the nonlinearity of the FETs 308a and 308b. To improve this situation, a pair of fixed resistors R may be used in the tunable degeneration circuit 306 with one inserted in the emitter circuit of each input transistor 302a and 302b as shown in FIG. 4. A degeneration circuit implemented with fixed resistors in combination with FETs as shown in FIG. 4 may result in some improvement in linearity while reducing the tuning range.

Figure 5:
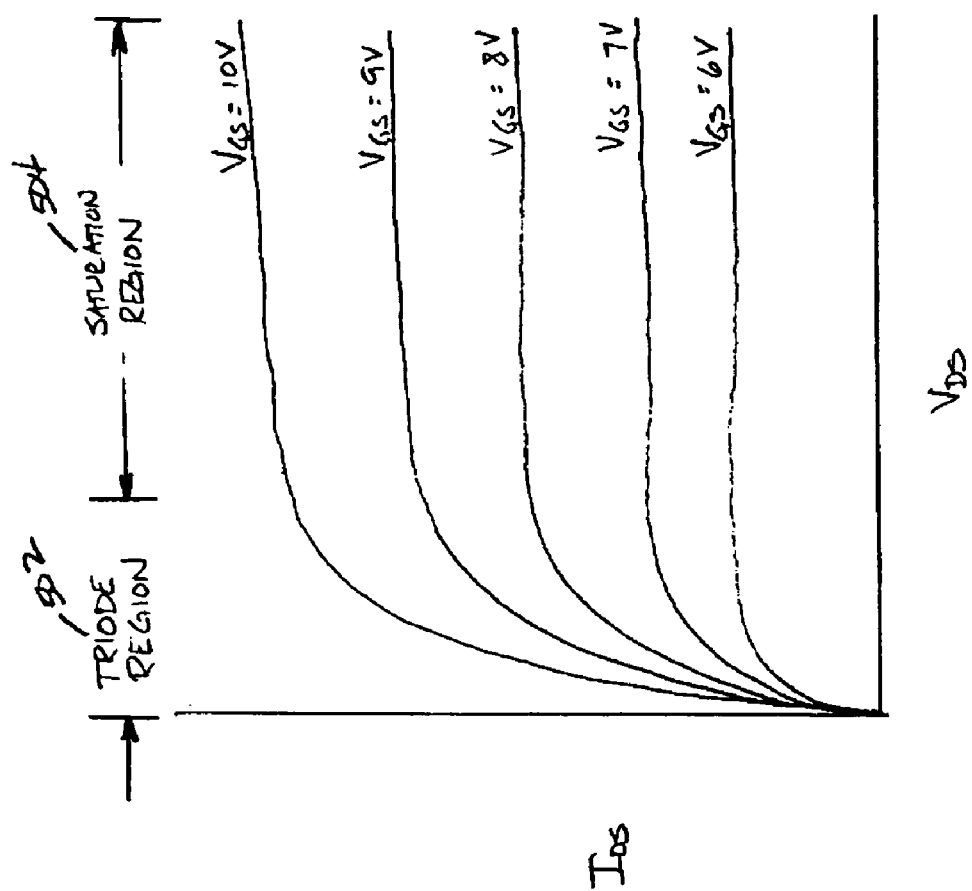
FIG. 5 is a graphical illustration showing the drain characteristic curves of a FET.

The nonlinearity of the FET will be discussed with reference to the set of drain characteristic curves shown in FIG. 5. Each drain characteristic curve plots the drain-to-source current ($I_{DS}$) as a function of the drain-to-source voltage ($V_{DS}$) for a given gate-to-source voltage ($V_{GS}$).

The drain characteristic curves may be divided into two regions: a triode region 502 and a saturation region 504. In the triode region 502, the drain characteristics are given by:

$$I_{DS} = \mu C o \frac{W}{L}\left[(V_{GS} - V_T)V_{DS} - \frac{V_{DS}^2}{2}\right] \quad (2)$$

where: $\mu$ is the mobility of the majority carrier;
$C_o$ is the gate capacitance per unit area;
L is the channel length;
W is the channel width; and
$V_T$ is the threshold gate-to-source voltage $V_{GS}$ for the FET to begin conducting.

The resistance $r_{DS}$ of the FET is equal to the drain-to-source voltage divided by the drain-to-source current ($V_{DS}/I_{DS}$), and can be derived from equation (2) as follows:

$$r_{ds} \approx \frac{1}{\mu C o \frac{W}{L}\left[(V_{GS} - V_T) - \frac{V_{DS}}{2}\right]} \quad (3)$$

Equation (3) may be rewritten as follows:

$$r_{ds} \approx \frac{1}{\left[\mu C o \frac{W}{L}(V_{GS} - V_T)\right]\left[1 - \frac{V_{DS}}{2(V_{GS} - V_T)}\right]} \quad (4)$$

One can readily see by inspection from equation (4) that the resistance $r_{DS}$ of the FET is independent of the drain-to-source voltage $V_{DS}$ when the last term in the denominator becomes zero. In other words, once the gate-to-source voltage $V_{GS}$ is tuned to a fixed value to compensate for process, voltage and temperature variations, the feedback resistance $r_{DS}$ is constant when the last term in the denominator becomes zero, regardless of changes in the drain-to-source voltage $V_{DS}$ when a signal is applied to the base of the input transistors 302a and 302b (see FIG. 3). Accordingly, this term may provide a good indication of the linearity of the FET, and is represented below as a linearity factor $f_{LIN}$:

$$f_{LIN} = \frac{V_{DS}}{2(V_{GS} - V_T)} \quad (5)$$

Equation (5) shows that the linearity of the FET may be increased by decreasing the quiescent drain-to-source voltage $V_{DS}$ and increasing the tuning or gate-to-source voltage $V_{GS}$. This is consistent with FIG. 5 which shows that each drain characteristic curve is more linear at lower drain-to-source voltages $V_{DS}$. FIG. 5 also shows that for any given drain-to-source voltage $V_{DS}$ in the triode region 502, the drain characteristic curves become progressively more linear as the gate-to-source voltage $V_{GS}$ is increased.

Figure 6:
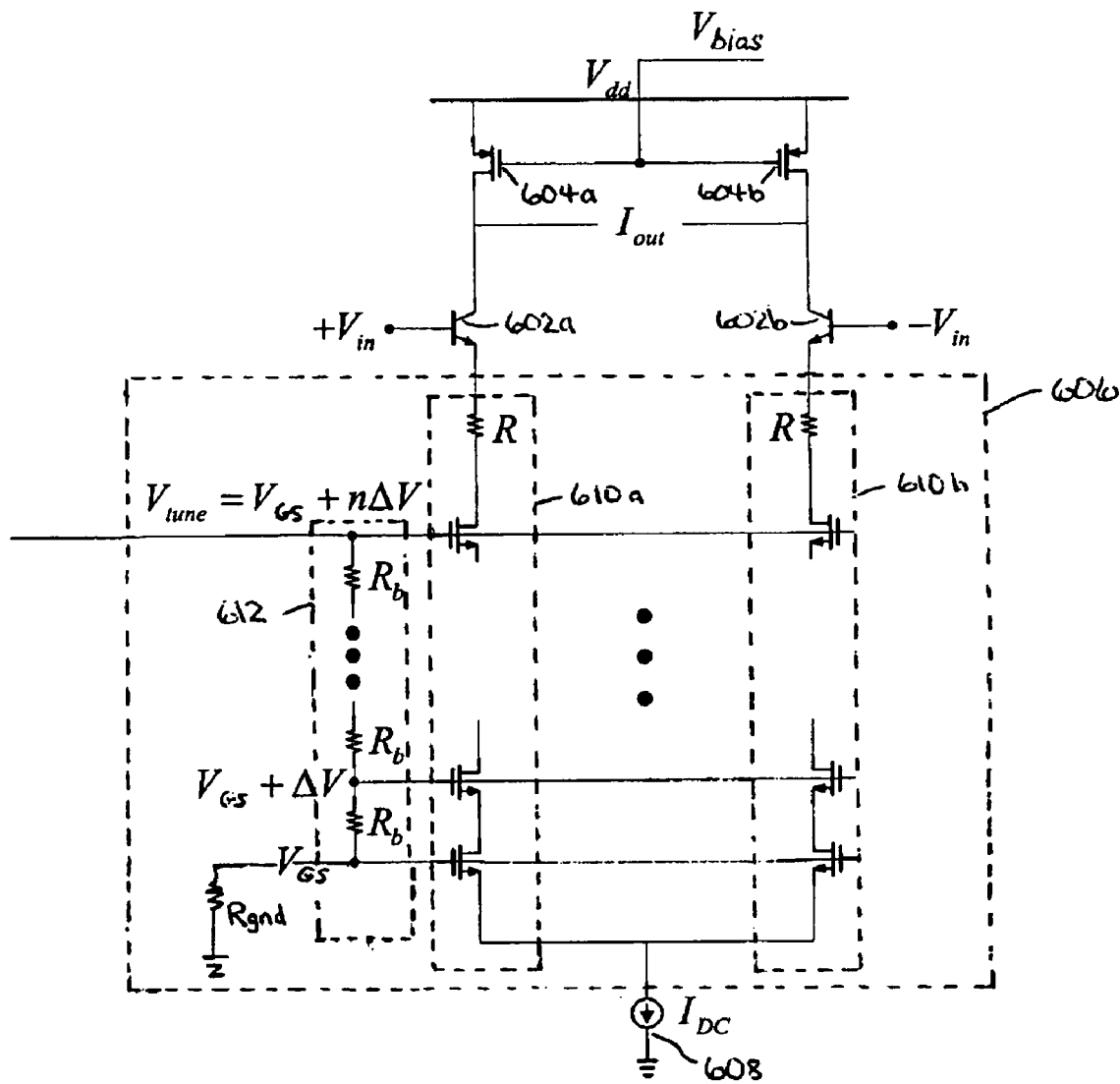
FIG. 6 is a schematic diagram of a tunable Gm-cell employing degeneration FETs operating in the linear portion of the triode region.

FIG. 6 is a schematic diagram of a tunable Gm-cell which uses degeneration FETs operating in the linear portion of the triode region. This approach results in a wide tuning range without compromising the linearity of the cell. The Gm-cell 104 may include a pair of input devices. These input devices are shown in FIG. 6 as bipolar transistors 602a and 602b, but alternatively, may be any input device. In this example, the bipolar transistors 602a and 602b may each have an active load 604a and 604b in their respective collector circuits. The Gm-cell 104 may also include a tunable degeneration circuit 606 coupled to the input devices, and in the example shown in FIG. 6, coupled to the emitters of the bipolar transistors 602a and 602b. A constant source 608 may be coupled to the tunable degeneration circuit 606.

As shown in FIG. 6, the tunable degeneration circuit 606 may include a first leg 610a coupled to the emitter of one bipolar transistor 602a and a second leg 610b coupled to the emitter of the other bipolar transistor 602b. The first leg 610a may include a feedback resistor R connected in series with a first set of FETs ($Q_{11}$–$Q_{1n}$), and the second leg 610b may also include a feedback resistor R connected in series with a second set of FETs ($Q_{21}$–$Q_{2n}$). A "series" connection means that the same currents flow through the components. In FIG. 6, the feedback resistor and FETs in the first (or second leg) of the tunable generation circuit 606 are said to be in series because the same drain-to-source current $I_{DS}$ flows through each of them. The series "connection" can either be direct as shown or, where appropriate in the context, can be indirect, e.g., through intervening or intermediary devices or other means.

The tunable degeneration circuit 606 may also include a tapped voltage divider network 612. In the example shown in FIG. 6, the tapped voltage divider network 612 is shown with a number of resistors $R_b$ connected in series, although other voltage divider networks may be used. The tapped voltage divider network 612 includes a positive input for receiving a tuning voltage and a negative input connected to ground through a resistor $R_{gnd}$. The tapped voltage divider network also includes n taps. As shown in FIG. 6, the first tap $T_1$ is connected to the gates of the FETs $Q_{11}$ and $Q_{21}$ in the first and second legs 610a and 610b, respectively. Similarly, the second tap $T_2$ is shown connected to the gates of the FETs $Q_{12}$ and $Q_{22}$, and in the $n^{th}$ tap $T_n$ is shown connected to the gates of the FETs $Q_{1n}$ and $Q_{2n}$.

The component values may be selected to yield a linear Gm-cell with good tuning range. This may be achieved in a variety of ways. A good starting point for selecting component values is the zero-excitation operating point of the bipolar transistors 602a and 602b. The zero-excitation operating point, typically referred to as the "quiescent" point, may be selected to bias the transistors in the active region, and preferably, in the center of each transistor's output characteristic curve. With the transistors operating at their respective quiescent points, time-varying excursions of the input signal below the pole frequency should be faithfully reproduced at the output.

Once the quiescent current through each bipolar transistor 602a and 602b is determined, the drain-to-source voltage $V_{DS}$ for each FET in the degeneration circuit 606 may be computed using equation (2). The Gm-cell may operate with reasonable linearity with a single FET in each leg 610a and 610b of the degeneration circuit 606 if the computed drain-to-source voltage $V_{DS}$ is relatively small. However, as the computed drain-to-source voltage $V_{DS}$ increases, a single FET may begin to operate in a non-linear manner as seen by inspection from the drain characteristic curves of FIG. 5. By using multiple FETs in each leg 610a and 610b of the degeneration circuit 606, the drain-to-source voltage $V_{DS}$ of each FET can be reduced. Referring to FIG. 5, this moves the operating point of each FET down the drain characteristic curve towards the linear portion of the triode region resulting in a more linear Gm-cell.

Once the appropriate number of FETs are determined, further improvements in linearity may be achieved by increasing the gate-to-source voltage $V_{GS}$. This may be achieved with the voltage divider network 612 in the degeneration circuit 606. The gate-to-source voltage $V_{GS}$ for the lower FETs $Q_{11}$ and $Q_{21}$ ($V_{GS1}$) may be set by the resistor $R_{gnd}$ at the negative input to the voltage divider network 612. The gate-to-source voltages $V_{GS}$ applied to the FETs may be progressively increased from the bottom of the voltage divider network to the top with a series of resistors $R_b$ between each tap. The gate-to-source voltage $V_{GS}$ applied to each FET should be increased to compensate for the drain-to-source $V_{DS}$ voltage drop of the FET immediately below it. Thus, the gate-to-source $V_{GS}$ of the FETs $Q_{12}$ and $Q_{22}$ should be $V_{GS1}+\Box V$, and the gate-to-source $V_{GS}$ of the FETs $Q_{1n}$ and $Q_{2n}$ should be $V_{GS1}+n\Box V$, where $\Box V$ can be represented by the following equation:

$$\Delta V \approx \frac{I_{DC}}{2} \cdot r_{ds} \tag{6}$$

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A transconductance cell, comprising:
    a tunable degeneration circuit having a plurality of field effect transistors connected in series, each of the field effect transistors having a gate configured to receive a tuning voltage, wherein the tunable degeneration circuit further comprises a tapped voltage divider network configured to apuly the tuning voltages to each of the field effect transistors through a different one of the taps, wherein the tapped voltage divider network is configured to generate a differential voltage between each adjacent pair of the taps when the tuning voltage is applied to the tapped voltage divider network, the differential voltage being equal to the quiescent drain-to-source voltage of one of the field effect transistors.

2. The transconductance cell of claim 1 wherein the tunable degeneration circuit further comprises a feedback resistor connected in series with the field effect transistors.

3. The transconductance cell of claim 1 wherein the tapped voltage divider network comprises one or more resistors connected in series, each of said one or more resistors being positioned between a different adjacent pair of the taps.

4. A transconductance cell, comprising;
    a tunable degeneration circuit having a plurality of field effect transistors connected in series, each of the field effect transistors having a gate configured to receive a tuning voltage, wherein the tunable degeneration circuit further comprises a tapped voltage divider network configured to apply the tuning voltage to each of the field effect transistors through a different one of the taps, wherein each of said one or more resistors has a value that results in a differential voltage between each adjacent pair of the taps when the tuning voltage is applied to the tapped voltage divider network, the differential voltage being equal to the quiescent drain-to-source voltage of one of the field effect transistors.

5. A transconductance cell, comprising:
a tunable degeneration circuit having a tapped voltage divider network configured to receive a tuning voltage, and a plurality of field effect transistors connected in series, each of the field effect transistors having a gate coupled to a different one of the taps, wherein the tapped voltage divider network comprises one or more resistors connected in series, each of said one or more resistors being positioned between a different adjacent pair of the taps, wherein each of said one or more resistors has a value that results in a differential voltage between each different adjacent pair of the taps when the tuning voltage is applied to the tapped voltage divider network, the differential voltage being equal to the quiescent drain-to-source voltage of one of the field effect transistors.

6. The transconductance cell of claim 5 wherein the tunable degeneration circuit further comprises a feedback resistor connected in series with the field effect transistors.

7. A differential transconductance cell, comprising:
a pair of input transistors; and
a tunable degeneration circuit having a first leg comprising a plurality of field effect transistors connected in series and a second leg comprising a plurality of field effect transistors connected in series, one end of the first leg being coupled to a first one of the input transistors and one end of the second leg being coupled to a second one of the input transistors, each of the field effect transistors having a gate configured to receive a tuning voltage, wherein the tunable degeneration circuit further comprises a tapped voltage divider network, each of a plurality of the taps being configured to apply the tuning voltage to a different pair of the field effect transistors, each of field effect transistor pairs comprising one of the field effect transistors from the first leg and one of the field effect transistors from the second leg, wherein the tanned voltage divider network is configured to generate a differential voltage between each of adjacent pair of the taps when the tuning voltage is applied to the tapped voltage divider network, the differential voltage being equal to the quiescent drain-to-source voltage of one of the field effect transistors.

8. The transconductance cell of claim 7 wherein the tunable degeneration circuit further comprises a first feedback resistor connected in series with the field effect transistors in the first leg and a second feedback resistor connected in series with the field effect transistors in the second leg.

9. The transconductance cell of claim 7 wherein the tapped voltage divider network comprises one or more resistors connected in series, each of said one or more resistors being positioned between a different adjacent pair of the taps.

10. A differential transconductance cell, comprising:
a pair of input transistors; and
a tunable degeneration circuit having a first leg comprising a plurality of field effect transistors connected in series and a second leg comprising a plurality of field effect transistors connected in series, one end of the first leg being coupled to a first one of the input transistors and one end of the second leg being coupled to a second one of the input transistors, each of the field effect transistors having a gate configured to receive a tuning voltage, wherein the tapped voltage divider network comprises one or more resistors connected in series, each of said one or more resistors being positioned between a different adjacent pair of the taps, wherein each of said one or more resistors has a value that results in a differential voltage between each of the different adjacent pairs of the taps when the tuning voltage is applied to the tapped voltage divider network, the differential voltage being equal to the quiescent drain-to-source voltage of one of the field effect transistors.

11. A differential transconductance cell, comprising:
a pair of input devices; and
a tunable degeneration circuit having a first leg comprising a plurality of field effect transistors connected in series and a second leg comprising a plurality of field effect transistors connected in series, one end of the first leg being coupled to a first one of the input transistors and one end of the second leg being coupled to a second one of the input transistors, the tunable degeneration circuit further having a tapped voltage divider network configured to receive a tuning voltage, each pair of field effect transistors having gates coupled to a different one of a plurality of the taps, each of the field effect transistor pairs comprising one of the field effect transistors from the first leg and one of the field effect transistors from the second leg, wherein the tapped voltage divider network comprises one or more resistors connected in series, each of said one or more resistors being positioned between a different adjacent pair of the taps, wherein each of said one or more resistors has a value that results in a differential voltage between each of the different adjacent pairs of the taps when the tuning voltage is applied to the tapped voltage divider network, the differential voltage being equal to the quiescent drain-to-source voltage of the field effect transistors.

12. The transconductance cell of claim 11 wherein the tunable degeneration circuit further comprises a first feedback resistor connected in series with the field effect transistors in the first leg, and a second feedback resistor connected in series with the field effect transistors in the second leg.

* * * * *